United States Patent
Engstrom (10) Patent No.: US 7,065,333 B2
(45) Date of Patent: Jun. 20, 2006

(54) METHOD AND SYSTEM FOR PLAYING BROADCASTS WITH A MOBILE TELECOMMUNICATION DEVICE THAT INCLUDES MULTIPLE TUNERS

(75) Inventor: G. Eric Engstrom, Kirkland, WA (US)

(73) Assignee: Wildseed, Ltd., Kirkland, WA (US)

( * ) Notice: Subject to any disclaimer, the term of this patent is extended or adjusted under 35 U.S.C. 154(b) by 128 days.

(21) Appl. No.: 10/477,048

(22) PCT Filed: May 10, 2002

(86) PCT No.: PCT/US02/14872

§ 371 (c)(1),
(2), (4) Date: Nov. 7, 2003

(87) PCT Pub. No.: WO02/093761

PCT Pub. Date: Nov. 21, 2002

(65) Prior Publication Data

US 2004/0171377 A1 Sep. 2, 2004

Related U.S. Application Data

(60) Provisional application No. 60/290,592, filed on May 11, 2001.

(51) Int. Cl.
*H04B 1/18* (2006.01)

(52) U.S. Cl. .................. 455/184.1; 455/186.1; 455/419

(58) Field of Classification Search ........... 455/419, 455/3.01, 3.02, 3.03, 184.1, 186.1, 154.1, 455/150.1, 158.1, 414.3, 130, 3.04
See application file for complete search history.

(56) References Cited

U.S. PATENT DOCUMENTS

| | | | | |
|---|---|---|---|---|
| 5,572,442 A | * | 11/1996 | Schulhof et al. | 709/219 |
| 5,694,455 A | * | 12/1997 | Goodman | 455/413 |
| 5,797,087 A | * | 8/1998 | Lee | 455/181.1 |
| 5,913,153 A | * | 6/1999 | Nakamoto et al. | 455/78 |
| 6,563,805 B1 | * | 5/2003 | Ma et al. | 370/325 |
| 6,725,022 B1 | * | 4/2004 | Clayton et al. | 455/154.1 |
| 6,748,237 B1 | * | 6/2004 | Bates et al. | 455/553.1 |
| 6,799,201 B1 | * | 9/2004 | Lee et al. | 709/217 |
| 2002/0072341 A1 | * | 6/2002 | Ricard et al. | 455/174.1 |
| 2003/0009772 A1 | * | 1/2003 | Karr | 725/142 |
| 2004/0052504 A1 | * | 3/2004 | Yamada et al. | 386/68 |

* cited by examiner

Primary Examiner—Sonny Trinh
(74) Attorney, Agent, or Firm—Schwabe, Williamson & Wyatt, P.C.

(57) ABSTRACT

The invention provides a method, system, and apparatus for finding, playing, and recording broadcasts on a mobile device (400) that includes two or more tuners and also works as a cellular telephone. The user can provide specific preferences or a pattern of use is employed by the mobile device to identify a broadcast. The mobile device tunes one tuner (452) to an identified broadcast and plays it for the user. While one tuner is playing a broadcast, the other tuner (453) is employed to scan for another broadcast based on user preference. When another broadcast is identified, the other tuner can start playing the scanned broadcast, cause it to be recorded for play back at a later time, or resume scanning for yet another broadcast based on user preference. When the mobile device is used for other purposes, the mobile device can resume playing a broadcast from the point of interruption.

27 Claims, 9 Drawing Sheets

METHOD AND SYSTEM FOR PLAYING BROADCASTS WITH A MOBILE TELECOMMUNICATION DEVICE THAT INCLUDES MULTIPLE TUNERS

RELATED APPLICATION

This utility application is related to a previously filed United States Provisional Application, Application No. 60/290,592, filed on May 11, 2001, the benefit of the earlier filing date of which is hereby claimed under 35 U.S.C. § 119(e).

FIELD OF THE INVENTION

The present invention is related to mobile telecommunication devices, and more specifically to playing and recording broadcasts with a mobile telecommunication device.

BACKGROUND OF THE INVENTION

Since their introduction, the number of services and features for cellular telephones has steadily increased. At first, these mobile devices operated on analog wireless networks that enabled voice communication and simple paging features. Later, digital wireless networks for cellular telephones were implemented to provide more advanced features for voice and data communication, such as encryption, caller identification and short message service (SMS) text messages. More recently, some cellular telephones enable the browsing of web pages on the Internet or other on-line services.

The functionality of cellular telephones has continued to increase and incorporate many of the features originally provided for in handheld electronic devices such as personal digital assistants (PDAs). Relatively simple PDA features such as maintaining a list of contacts, a calendar, appointments, and the like have been generally integrated into recent cellular telephone models. However, advanced multimedia features have not been generally available for cellular telephones. Typically, a cellular telephone user has to use a separate electronic device to record and play radio broadcasts. Also, since a user preference has not typically been used by portable electronic devices to identify and tune to a radio broadcast, a user often wastes considerable time finding a suitable broadcast. Thus, there exists a need for integrating some of these features into a mobile device such as a cellular telephone.

SUMMARY OF THE INVENTION

The present invention is directed to finding, playing, and recording broadcasts based on user preferences with a mobile device that includes two or more tuners and is capable of telecommunicating with others. The user preference can be obtained from the user and determined from a pattern of user behavior. When a tuner is tuned to a broadcast that is currently playing, another tuner is used to scan for another broadcast based on user preference. When the other broadcast based on user preference is located with the other tuner, the user can selectively play the currently playing broadcast or the other broadcast.

In another aspect of the invention, when the mobile device is selected for another purpose, the currently playing broadcast is interrupted and recorded from a point where the interruption occurred. When the other purpose is finished, the recording of the currently playing broadcast is played from the point of interruption. The other purpose can include playing a game, email, surfing the Internet and making a telephone call. Also, the broadcast can be audio, video, graphic, image, animation, color and text.

In yet another aspect of the invention, one of the currently playing broadcast or the other broadcast can be recorded and stored for playback. The broadcast can be recorded in any one of several formats including MP3, MPEG and WAV.

In still another aspect of the invention, a spectrum of frequencies can be scanned to locate the broadcast based on user preference. The spectrum can include AM, FM, television, and Satellite frequencies. Similarly, IP addresses for other broadcasts of streamed content provided over a network can be scanned.

In another aspect of the invention, the broadcast is identified with information, including station call letters, key word, Internet address, frequency, channel, artists, musical group, category, genre, title, and lyrics. The information may be received from the user, provided by a service, provided by a station and provided by a server over a network. Also, the server can manage a database of collected information.

In yet another aspect of the invention, the user preference is obtained by determining a pattern of user activity and creating the user preference based on the pattern of user activity.

Still another embodiment of the invention is directed to a mobile device that includes two tuners, player, recorder, display and an application for performing the actions for the methods and processes discussed above and below.

These and various other features, as well as advantages which characterize the present invention, will be apparent from a reading of the following detailed description and a review of the associated drawings.

DETAILED DESCRIPTION OF THE PREFERRED EMBODIMENT

In the following detailed description of exemplary embodiments of the invention, reference is made to the accompanying drawings, which form a part hereof, and which illustrate specific exemplary embodiments by which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "a broadcast spectrum" means any portion or portions of the range of frequencies, channels, or Internet Protocol (IP) addresses employed for broadcasting that are selected for tuning or search in conjunction with the practice of the invention disclosed herein. The term "broadcast" includes but is not limited to commercial radio and television stations, Internet radio and other broadcasts of streamed content. The term "user preference" can include a plurality of elements. For example, a user preference for disco music circa 1980 has at least two elements, i.e., the type of music and the era. Referring to the drawings, like numbers indicate like parts throughout the views. Additionally, a reference to the singular includes a reference to the plural, unless otherwise stated or inconsistent with the disclosure herein.

The present invention is directed to a method, system, and apparatus for finding, playing, and recording broadcasts with a mobile device that includes two or more tuners and can also operate as a telecommunication device, such as a cellular telephone, pager or email client. For purposes of simplifying the description of the nature of the invention in these specifications, the broadcast may be referred to as a commercial radio program, and user preference may be referred to as relating to songs. Such references are not intended to limit the disclosure or the claims herein, but are merely exemplary.

Briefly described, the user inputs preferences for broadcasts or a pattern of use is employed to determine user preference. The mobile device searches for a broadcast based upon the user preference, identifies such a broadcast, tunes to the broadcast, and plays the broadcast. The broadcast may be played in real-time or recorded for playback in the future. Also, while one tuner is playing a broadcast, the other tuner can scan for another broadcast based on user preference. When another broadcast is identified, the other tuner can start playing the other broadcast, cause it to be recorded for play back at a later time, or resume scanning for another broadcast based on user preference. Additionally, the playing of a broadcast can be automatically interrupted when the mobile device is used for other purposes, such as playing a game or making a cellular telephone call. In this case, the mobile device can resume playing the broadcast from the point of interruption when the other purpose is completed.

Illustrative Operating Environment

Figure 1:
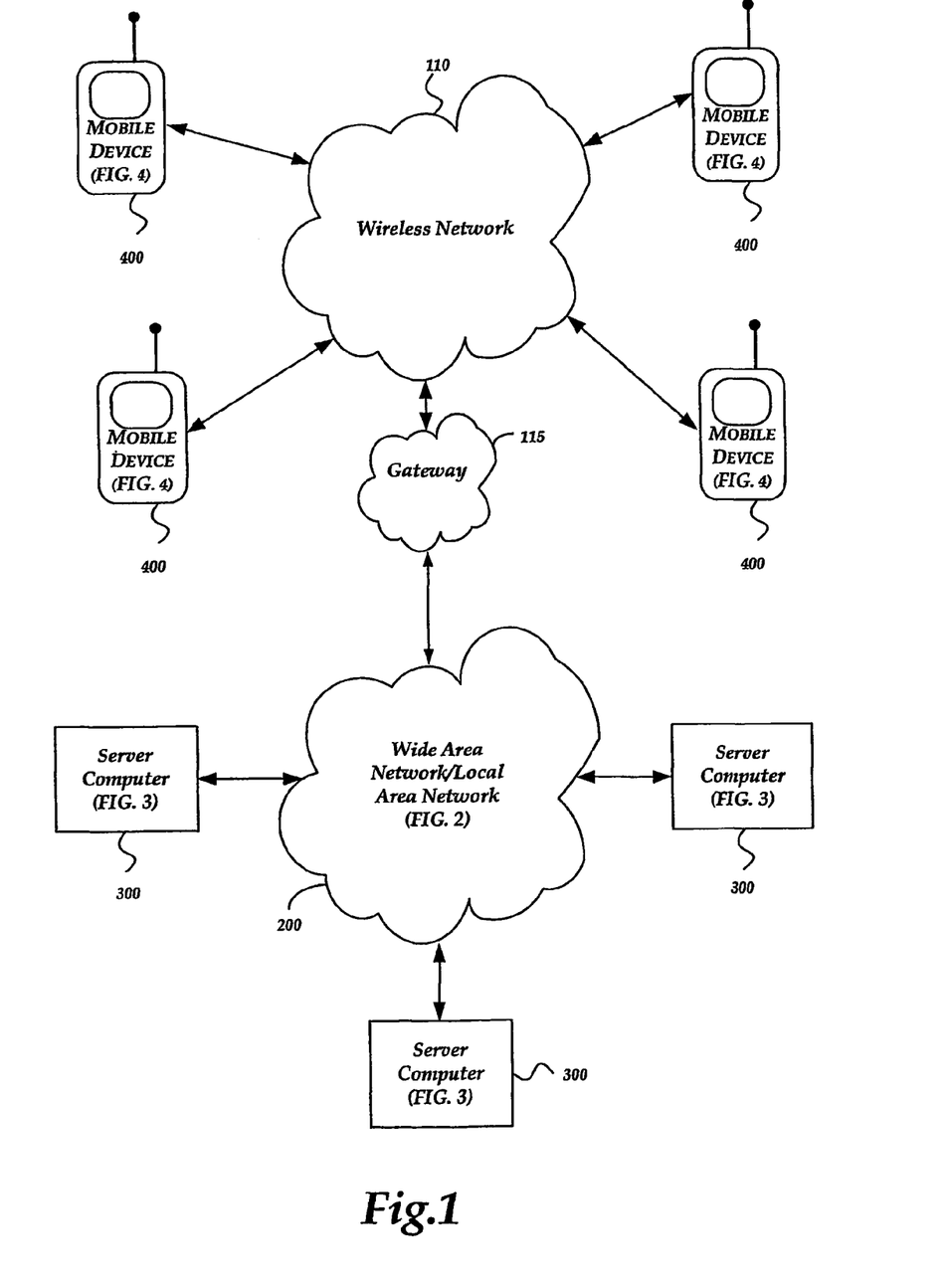
FIG. 1 is a schematic diagram that shows an exemplary system overview.

With reference to FIG. 1, an exemplary system in which the invention operates includes wireless mobile devices 400, wireless network 110, gateway 115, wide area network (WAN)/local area network (LAN) 200 and one or more world wide web (WWW) servers 300.

Figure 4:
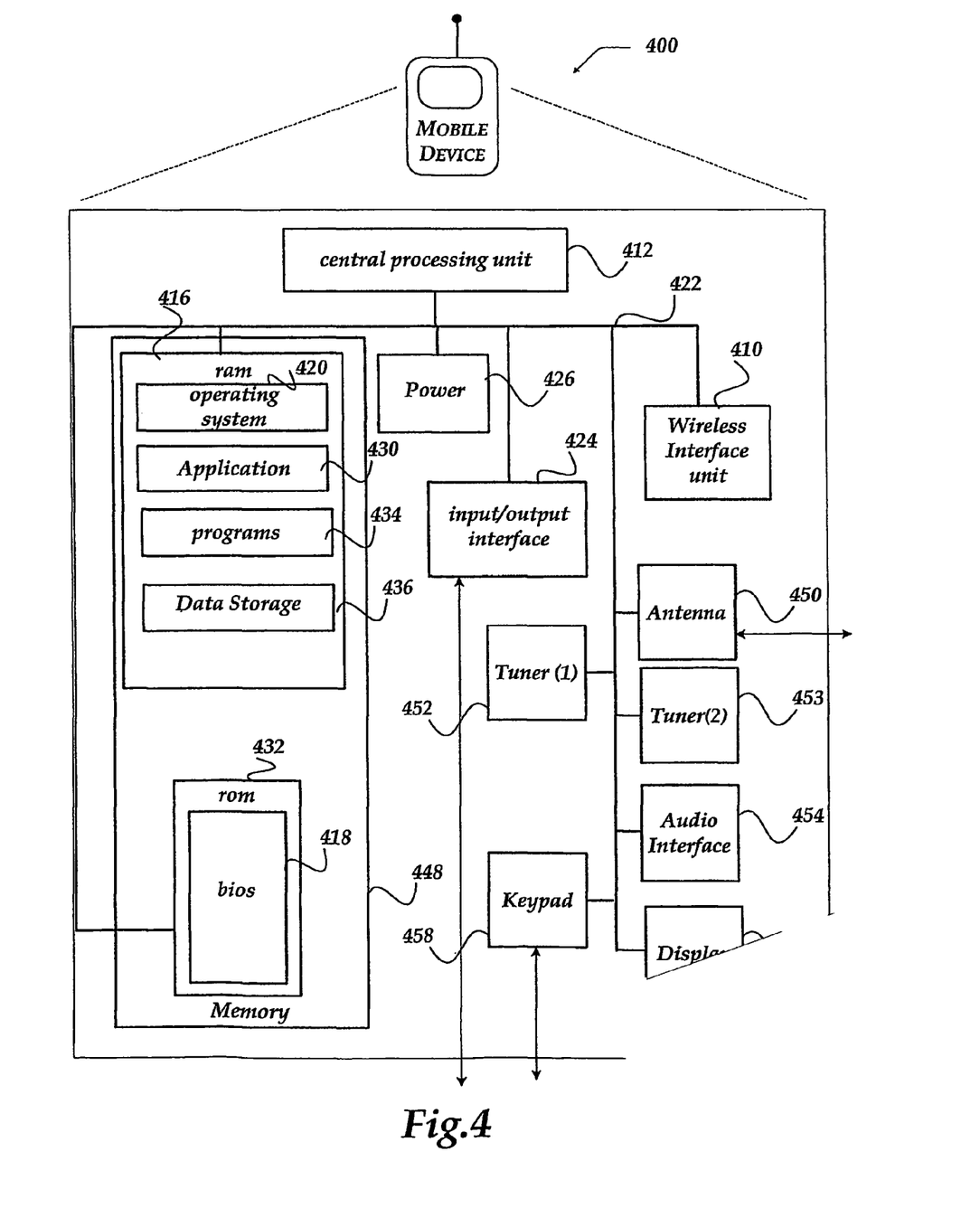
FIG. 4 is a schematic diagram that illustrates an exemplary mobile device.

Wireless devices 400 are coupled to wireless network 110 and are described in more detail in conjunction with FIG. 4. Generally, mobile devices 400 include any device capable of connecting to a wireless network such as wireless network 110. Such devices include cellular telephones, smart phones, pagers, radio frequency (RF) devices, infrared (IR) devices, citizen band radios (CBs), integrated devices combining one or more of the preceding devices, and the like. Mobile devices 400 may also include other devices that have a wireless interface such as PDAs, handheld computers, personal computers, multiprocessor systems, microprocessor-based or programmable consumer electronics, network PCs, wearable computers, and the like.

Wireless network 110 transports information to and from devices capable of wireless communication, such as mobile devices 400. Wireless network 110 may include both wireless and wired components. For example, wireless network 110 may include a cellular tower that is linked to a wired telephone network. Typically, the cellular tower carries communication to and from cell phones, pagers, and other wireless devices, and the wired telephone network carries communication to regular phones, long-distance communication links, and the like.

Wireless network 110 is coupled to WAN/LAN 200 through gateway 115. Gateway 115 routes information between wireless network 110 and WAN/LAN 200. For example, a user using a wireless device may browse the Internet by calling a certain number or tuning to a particular frequency. Upon receipt of the number, wireless network 110 is configured to pass information between the wireless device and gateway 115. Gateway 115 may translate requests for web pages from wireless devices to hypertext transfer protocol (HTTP) messages, which may then be sent to WAN/LAN 200. Gateway 115 may then translate responses to such messages into a form compatible with the requesting device. Gateway 115 may also transform other messages sent from wireless devices 400 into information suitable for WAN/LAN 200, such as e-mail, audio, voice communication, contact databases, calendars, appointments, and the like.

Figure 2:
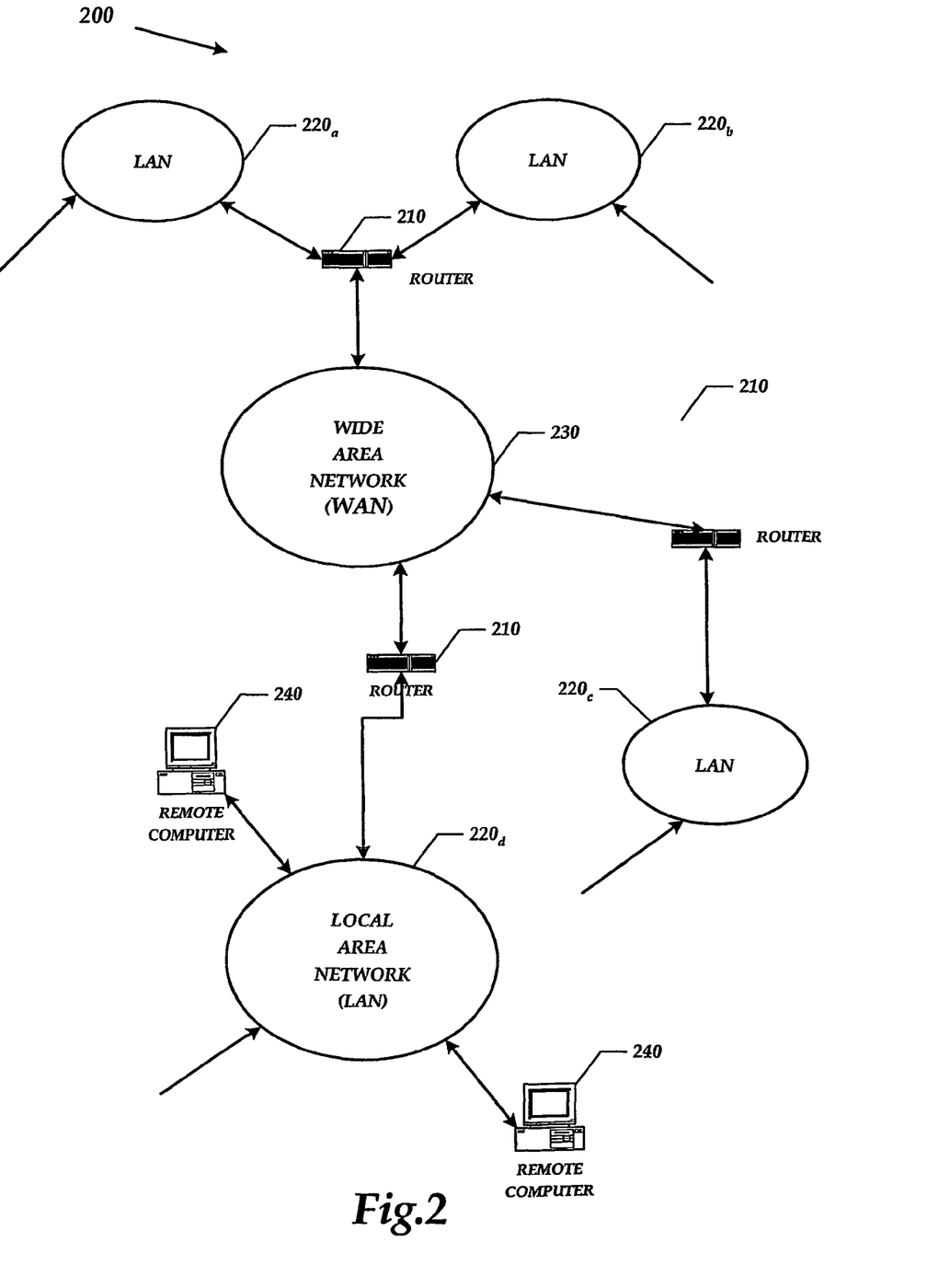
FIG. 2 is a schematic diagram that illustrates an exemplary system overview in which local area networks and a wide area network are interconnected by routers.

Typically, WAN/LAN 200 transmits information between computing devices as described in more detail in conjunction with FIG. 2. One example of a WAN is the Internet, which connects millions of computers over a host of gateways, routers, switches, hubs, and the like. An example of a LAN is a network used to connect computers in a single office. A WAN may connect multiple LANs.

WWW servers 300 are coupled to WAN/LAN 200 through communication mediums. WWW servers 300 provide access to information and services as described in more detail in conjunction with FIG. 3.

FIG. 2 shows another exemplary system in which the invention operates comprising a number of local area networks ("LANs") $220_{a-d}$ and wide area network ("WAN") 230 interconnected by routers 210. Routers 210 are intermediary devices on a communications network that expedite message delivery. On a single network linking many computers through a mesh of possible connections, a router receives transmitted messages and forwards them to their correct destinations over available routes. On an interconnected set of LANs—including those based on differing architectures and protocols—a router acts as a link between LANs, enabling messages to be sent from one to another.

Communication links within LANs typically include twisted wire pair, fiber optics, or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links, or other communications links known to those skilled in the art. Furthermore, computers, such as remote computer 240, and other related electronic devices can be remotely connected to either LANs 220$_{a-d}$ or WAN 230 via a modem and temporary telephone link. The number of WANs, LANs, and routers in FIG. 2 may be increased or decreased without departing from the spirit or scope of this invention. As such, it will be appreciated that the Internet itself may be formed from a vast number of such interconnected networks, computers, and routers and that an embodiment of the invention could be practiced over the Internet without departing from the spirit and scope of the invention.

The media used to transmit information in communication links as described above illustrates one type of computer-readable media, namely communication media Generally, computer-readable media includes any media that can be accessed by a computing device. Computer-readable media may include computer storage media, communication media, or any combination thereof.

Communication media typically embodies computer-readable instructions, data structures, program modules, or other data in a modulated data signal such as a carrier wave or other transport mechanism and includes any information delivery media The term "modulated data signal" means a signal that has one or more of its characteristics set or changed in such a manner as to encode information in the signal. By way of example, communication media includes wired media such as twisted pair, coaxial cable, fiber optics, wave guides, and other wired media and wireless media such as acoustic, RF, infrared, and other wireless media.

The Internet has recently seen explosive growth by virtue of its ability to link computers located throughout the world. As the Internet has grown, so has the WWW. Generally, the WWW is the total set of interlinked hypertext documents residing on HTTP servers around the world. Documents on the WWW, called pages or Web pages, are typically written in HTML (hypertext Markup Language) or some other markup language, identified by URLs (Uniform Resource Locators) that specify the particular machine and pathname by which a file can be accessed and transmitted from server to end user using HTTP. Codes, called tags, embedded in an HTML document associate particular words and images in the document with URLs so that a user can access another file, which may be halfway around the world, at the press of a key or the click of a mouse. These files may contain text (in a variety of fonts and styles), graphics images, movie files, media clips, and sounds as well as Java applets, ActiveX controls, or other embedded software programs that execute when the user activates them. A user visiting a Web page may also be able to download files from an FTP site and send messages to other users via email by using links on the Web page.

Figure 3:
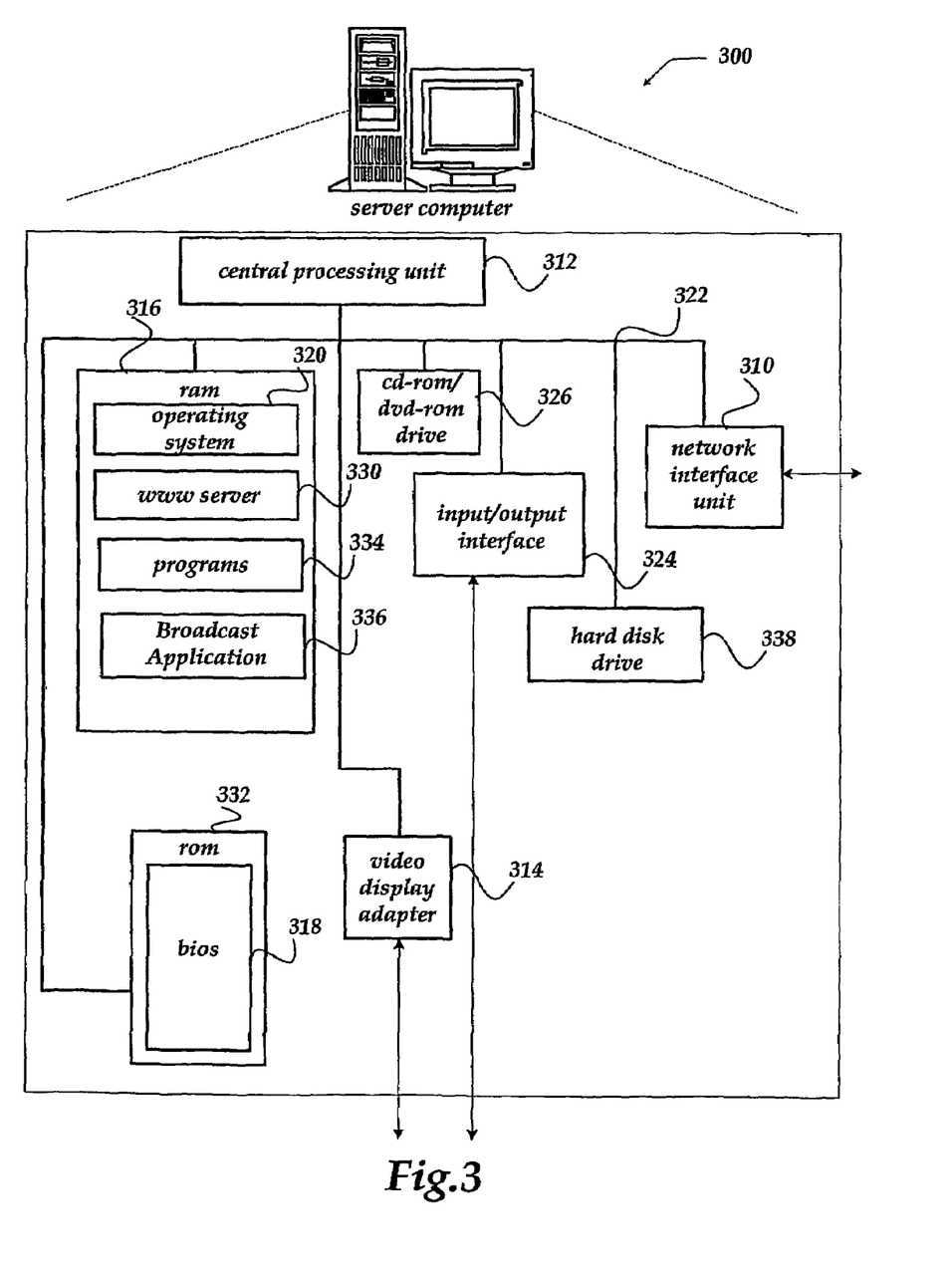
FIG. 3 is a schematic diagram that shows an exemplary server that is operative to provide a web site.

FIG. 3 shows an exemplary server computer 300 that is operative to provide a WWW site. Accordingly, WWW server 330 transmits WWW pages to browser applications executing on requesting devices to carry out this process. Moreover, WWW server 330 may transmit WWW pages to a requesting device that allows a user to participate in a WWW site. The transactions may take place over the Internet, WAN/LAN 200, or some other communications network.

The server computer 300 may include many more components than those shown in FIG. 3. However, the components shown are sufficient to disclose an illustrative embodiment for practicing the present invention. As shown in FIG. 3, server computer 300 is connected to WAN/LAN 200, or other communications network, via network interface unit 310. Network interface unit 310 includes the necessary circuitry for connecting server computer 300 to WAN/LAN 200, and is constructed for use with various communication protocols including the TCP/IP protocol. Typically, network interface unit 310 is a card contained within server computer 300.

Server computer 300 also includes processing unit 312, video display adapter 314, and a mass memory, all connected via bus 322. The mass memory generally includes RAM 316, ROM 332, and one or more permanent mass storage devices, such as hard disk drive 328, a tape drive, CD-ROM/DVD-ROM drive 326, and/or a floppy disk drive. The mass memory stores operating system 320 for controlling the operation of server computer 330. It will be appreciated that this component may comprise a general purpose server operating system, such as UNIX, LINUX™, or Microsoft WINDOWS NT®. Basic input/output system ("BIOS") 318 is also provided for controlling the low-level operation of server computer 330.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data for providing a WWW site. More specifically, the mass memory stores applications including WWW server 330, programs 334, and broadcast server 336. Information regarding broadcasts is collected from several sources for a database that is managed by broadcast server 336. This information may be provided by broadcast server 336 to mobile devices upon request.

WWW server 330 includes computer executable instructions which, when executed on server computer 300, generate WWW browser displays, including performing the logic described above. WWW server 300 may include a JAVA virtual machine, an SMTP handler application for transmitting and receiving email, an HTTP handler application for receiving and handing HTTP requests, JAVA applets for transmission to a WWW browser executing on a client computer, and an HTTP handler application for handling secure connections. The HTTPS handler application may be used for communication with external security applications (not shown), to send and receive private information in a secure fashion.

Server computer 300 also comprises input/output interface 324 for communicating with external devices, such as a mouse, keyboard, scanner, or other input devices not shown in FIG. 3. Likewise, server computer 300 may further comprise additional mass storage facilities such as CD-ROM/DVD-ROM drive 326 and hard disk drive 328. Hard disk drive 328 is utilized by server computer 300 to store, among other things, application programs, databases, and program data used by WWW server 330.

FIG. 4 shows an exemplary mobile device 400, according to one embodiment of the invention. Mobile device 400 may be arranged to transmit and receive data. For instance, mobile device 400 may send and receive SMS text messages from other mobile devices (not shown) and servers (See FIG. 3 and related discussion) as well as receiving broadcasts. The data transmissions may take place over the Internet, WAN/LAN 200, or some other communications network. Additionally, mobile device 400 may receive different types of broadcasts such as radio and enable telecommunication with others e.g., operate as a cellular telephone.

Mobile device 400 may include many more components than those shown in FIG. 4. However, the components shown are sufficient to disclose an illustrative embodiment for practicing the present invention. As shown in the figure, mobile device 400 includes processing unit 412, memory 448, RAM 416, ROM 432, operating system 420, broadcast application 430, programs 434, data storage 436, bios 418, power 426, input/output interface 424, wireless interface unit 410, antenna 450, tuners 452 and 453, audio interface 454, display 456, and keypad 458.

Mobile device 400 may connect to WAN/LAN 200, or other communications network, via wireless interface unit 410. Wireless interface unit 410 includes the necessary circuitry for connecting mobile device 400 to WAN/LAN 200, and is constructed for use with various communication protocols including the TCP/IP protocol. Wireless interface unit 410 may include a radio layer (not shown) that is arranged to transmit and receive broadcasts of radio frequency communications. Wireless interface unit 410 connects mobile device 400 to external devices, via a communications carrier or service provider.

Mass memory 448 generally includes RAM 416, ROM 432, and one or more data storage units 436. The mass memory stores operating system 420 for controlling the operation of mobile device 400. It will be appreciated that this component may comprise a general purpose server operating system as is known to those of ordinary skill in the art, such as a version of UNIX, LINUX™, or Microsoft WINDOWS®. Basic input/output system ("BIOS") 418 is also provided for controlling the low-level operation of mobile device 400.

The mass memory as described above illustrates another type of computer-readable media, namely computer storage media Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data used within mobile device 400. More specifically, the mass memory stores applications, including the mobile device broadcast play application 430, and programs 434. Programs 434 may include computer executable instructions which, when executed by mobile device 400, transmit and receive WWW pages, e-mail, audio, video, and the like. One or more programs 434 may be loaded into memory 448, and run under control of operating system 420. Broadcast play application 430 performs the methods described below. Examples of application programs include radio tuner programs, phone programs, communication programs, productivity programs (word processing, spreadsheet, etc.), browser programs, and the like. Mobile computing device 400 also includes ROM 432. ROM 432 may be used to store data that should not be lost when mobile device 400 loses power.

Mobile device 400 also comprises input/output interface 424 for communicating with external devices, such as a headset, or other input or output devices not shown in FIG. 4. Data storage 436 is utilized by mobile device 400 to store, among other things, application programs, databases, and program data used by the mobile device broadcast application 430. For example, user databases, product databases, image databases, and relational databases may be stored. The operation and implementation of these databases is well known to those skilled in the art.

Keypad 458 may be any input device arranged to receive inputs from a user. For example, keypad 458 may be a push button numeric dialer, or a keyboard, and may include light emitting devices that are configured to display when a button is pushed, or when activated by a program. Display 456 may be a liquid crystal display, or any other type of display commonly used in mobile devices. Display 456 may also be a touch screen arranged to receive user input.

Power supply 426 provides power to mobile device 400. According to one embodiment, a rechargeable battery provides power. The power may be also be provided by an external power source, such as an AC adapter or a powered docking cradle that supplements or recharges the battery.

As shown, mobile device 400 includes tuners 452 and 453, and audio interface 454. Audio interface 454 is arranged to receive and generate audio signals. For example, audio interface 454 may be coupled to a speaker (not shown) to generate sound (audio) from a telephone call, broadcasts provided by tuners 452 and 453, or from some other source. Audio interface 454 may be coupled to an input device, such as a microphone, to receive audio input, e.g., a voice for a telephone call. Tuners 452 and 453 may be any type of tuner configured to receive a broadcast. For example, tuners 452 and 453 may be an AM tuner, an FM tuner, an AM/FM tuner, a Satellite radio tuner, an Internet radio tuner, a television tuner, and the like. Tuners 452 and 453 may be separate hardware devices or implemented in software with a digital signal processor (not shown). The software tuners would employ various CODECs for tuning to different types of broadcasts.

In other embodiments, three or more tuners are included with the mobile device. For example, when three tuners are used with the mobile device, each tuner can be dedicated to separate functions, i.e., playing, recording and scanning for broadcasts.

In various embodiments, the mobile device may be a selected one of a wireless mobile phone, a pager, a personal digital assistant (PDA), a palm-sized computing device, a laptop computer, a portable radio, a portable MPx player, and a portable CD/DVD player.

Figure 5:
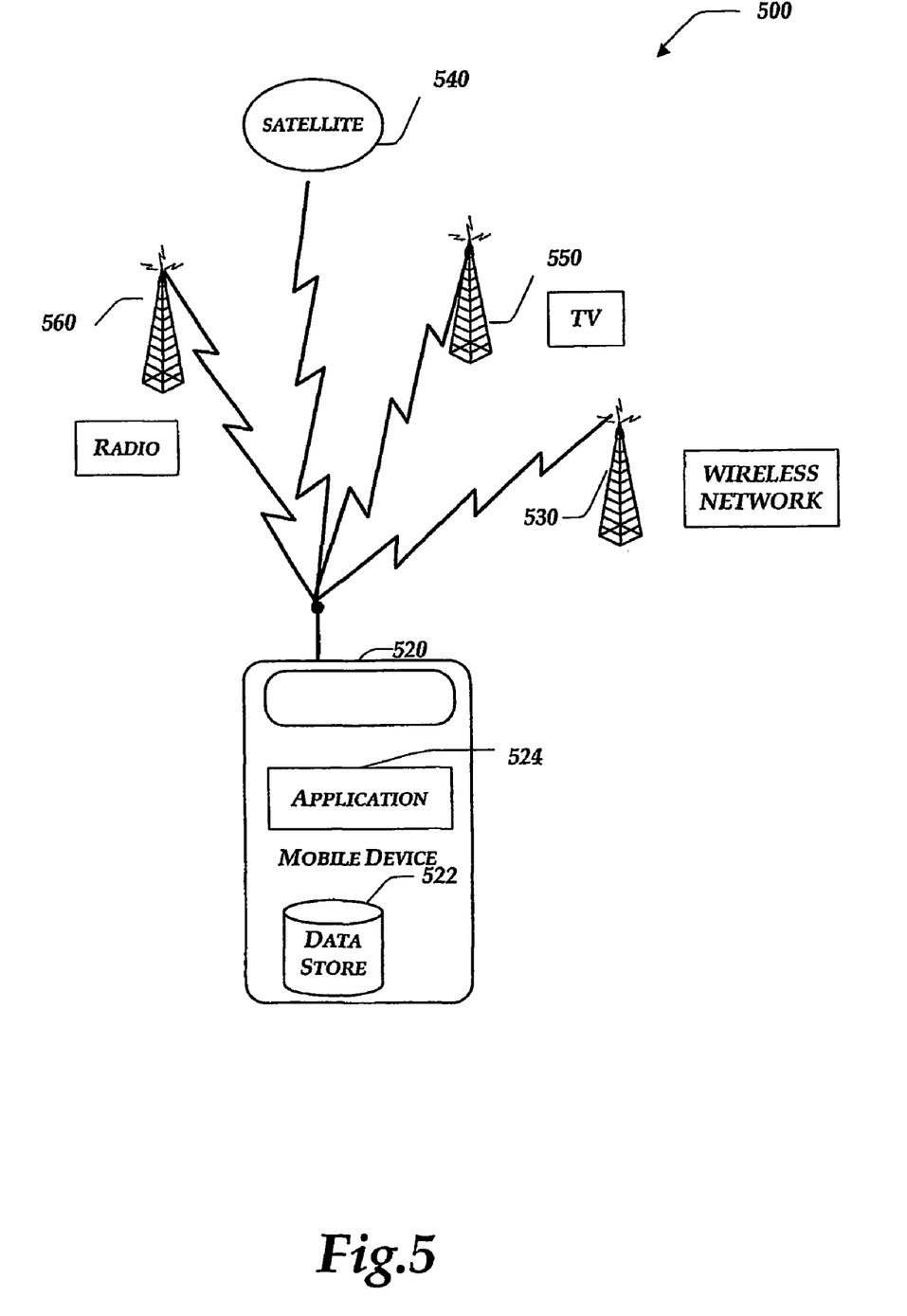
FIG. 5 is a schematic diagram that shows an exemplary system overview in which a mobile device is in wireless communication with several sources of broadcasts.

FIG. 5 shows a functional block diagram 500 generally illustrating mobile device 520 receiving broadcasts from several analog and digital sources. In particular, mobile device 520 is shown receiving broadcasts from radio 560, television 550, wireless network 530 and satellite 540. The wireless network and satellite signals are typically broadcast as digital information. Also, the television and radio signals are usually broadcast as analog information. The radio signals can include broadcasts over a known frequency spectrum including AM, FM and the like.

Application 524 employs the mobile device's two tuners to simultaneously scan, play, and record broadcasts from any of several broadcast sources. Application 524 may store broadcast information, such as schedules, locally in data store 522. In this and all figures, the broadcast can include audio, video, graphics, animations, images, color and text. The text may include station call letters, key word, Internet address, frequency, channel, artist, musical group, category, genre, title, station identifier and lyrics.

Figure 6:
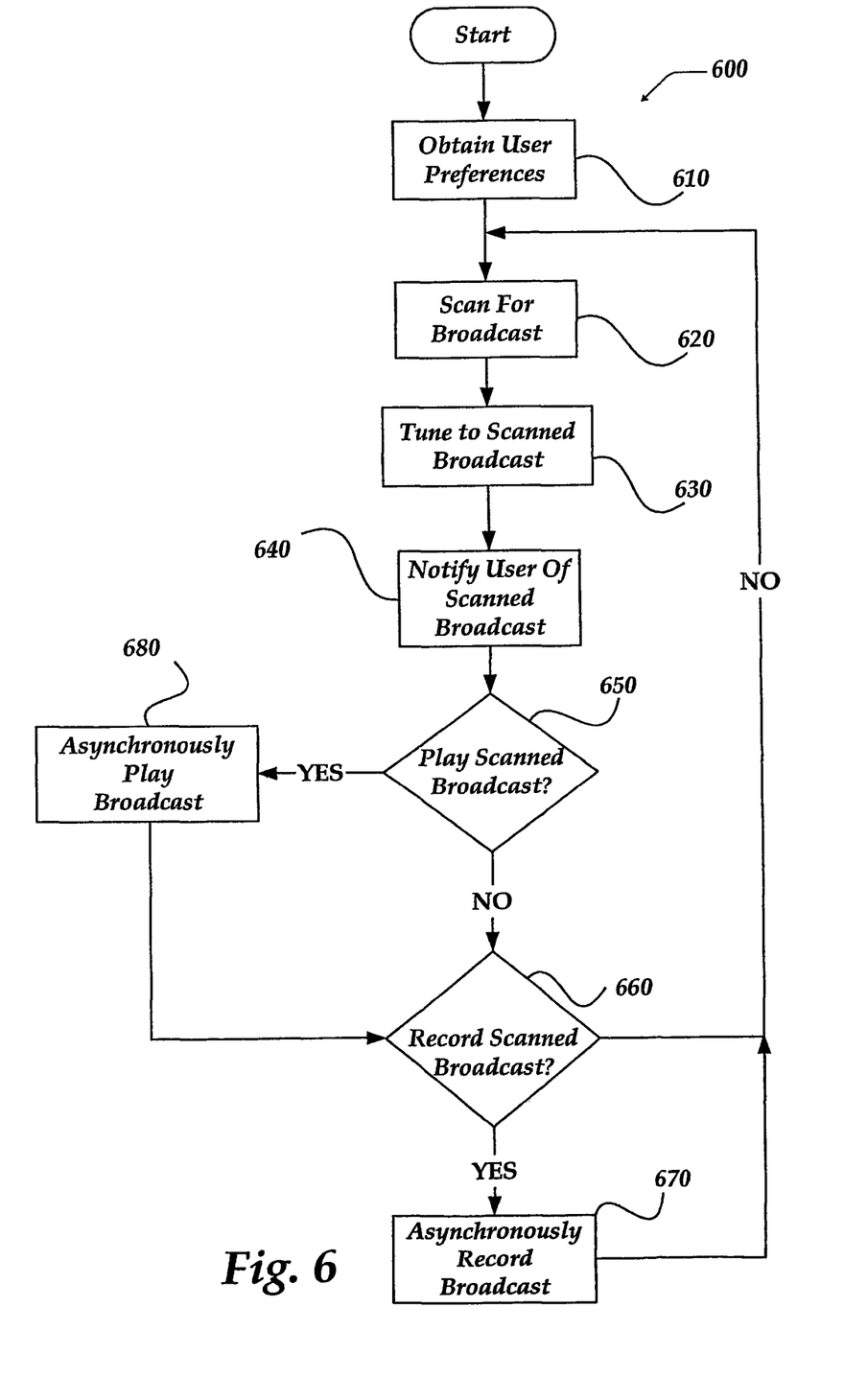
FIG. 6 is a flow chart that illustrates an overview of the process for scanning, playing and recording a broadcast with the mobile device.

FIG. 6 illustrates a flow chart 600 for scanning for a broadcast based on a user preference while playing another broadcast. After a start block, the process moves to block 610 where user preference is obtained for broadcasts. The preference may be provided by the user or user preference may be determined by the user's previous behavior, i.e., what broadcasts have been selected for playing with the mobile device. For example, the user may have a pattern of selecting broadcasts from "rock" stations. The user preference may identify a broadcast by station call letters, key word, channel, frequency, or Internet address and may identify an artist, song title, genre, or the like.

Transitioning to block 620, a first tuner scans a spectrum of known frequencies and/or Internet addresses for a broadcast based on user preference. At the same time, a second tuner remains tuned to a different broadcast that is currently being played by the mobile device. In one embodiment, the first tuner also scans for information that is separately broadcast in conjunction with a programmed broadcasts. For musical broadcasts, this separately broadcast information may provide the call letters of a station, name of the programmed broadcast, song title, artist, name of an album/collection of songs, song writer and other descriptors. One method of separately broadcasting this information in conjunction with a programmed broadcast is a Radio Data System (RDS) or Radio Broadcast Data System (RBDS). This type of information can be used to determine a when a particular broadcast corresponds to a user preference. Also, this information may be collected in a database managed by a broadcast server on a network; and provided to the mobile device upon request.

In another embodiment, a broadcast server on a network, such as discussed above in FIG. 3, can provide information related to broadcasts. The broadcast server can employ a database created by any appropriate method, including but not limited to scanning a broadcast spectrum, obtaining RDS and RDBS information from broadcasters or others. The server may also employ a database of playlist information provided by third parties. The playlist information could include advance information about the content of a station's schedule, such as song titles, artist, estimated broadcast time and date, and the like.

Next, the process moves to block 630 where the first tuner is tuned to the identified broadcast based on user preference. At block 640, notification is provided of the scanned broadcast based on the user preference. The notification may be, but not limited to, a display of textual/graphical information representing information provided by a RDS/RBDS, an audio acknowledgement, illuminated light source, and the like At decision block 650, a determination is made as to whether or not to play the scanned broadcast. If affirmative, the process moves to block 680 where the broadcast is asynchronously played by the first tuner with a mobile device. Next, the process moves to decision block 660 where a determination is made as to whether to record the scanned broadcast. Also, when the determination at decision block 650 is negative, the process moves to decision block 660. If the determination at decision block 660 is negative, the process loops back to block 620 and resumes performing substantially the same process as discussed above. Except now, the operation of the first tuner and second tuner are reversed. In particular, the second tuner scans for broadcasts based on user preference while the first tuner continues playing the previously scanned broadcast with the mobile device.

However, when the determination at decision block 660 is positive, the process moves to block 670 where the scanned broadcast is asynchronously recorded for play back at a later date. The broadcast may be recorded and stored in any one of several formats appropriate for the content of the broadcast, including, but not limited to, MP3, MPEG and WAV. Next, the process loops back to block 620 and resumes performing substantially the same process discussed above.

Figure 7:
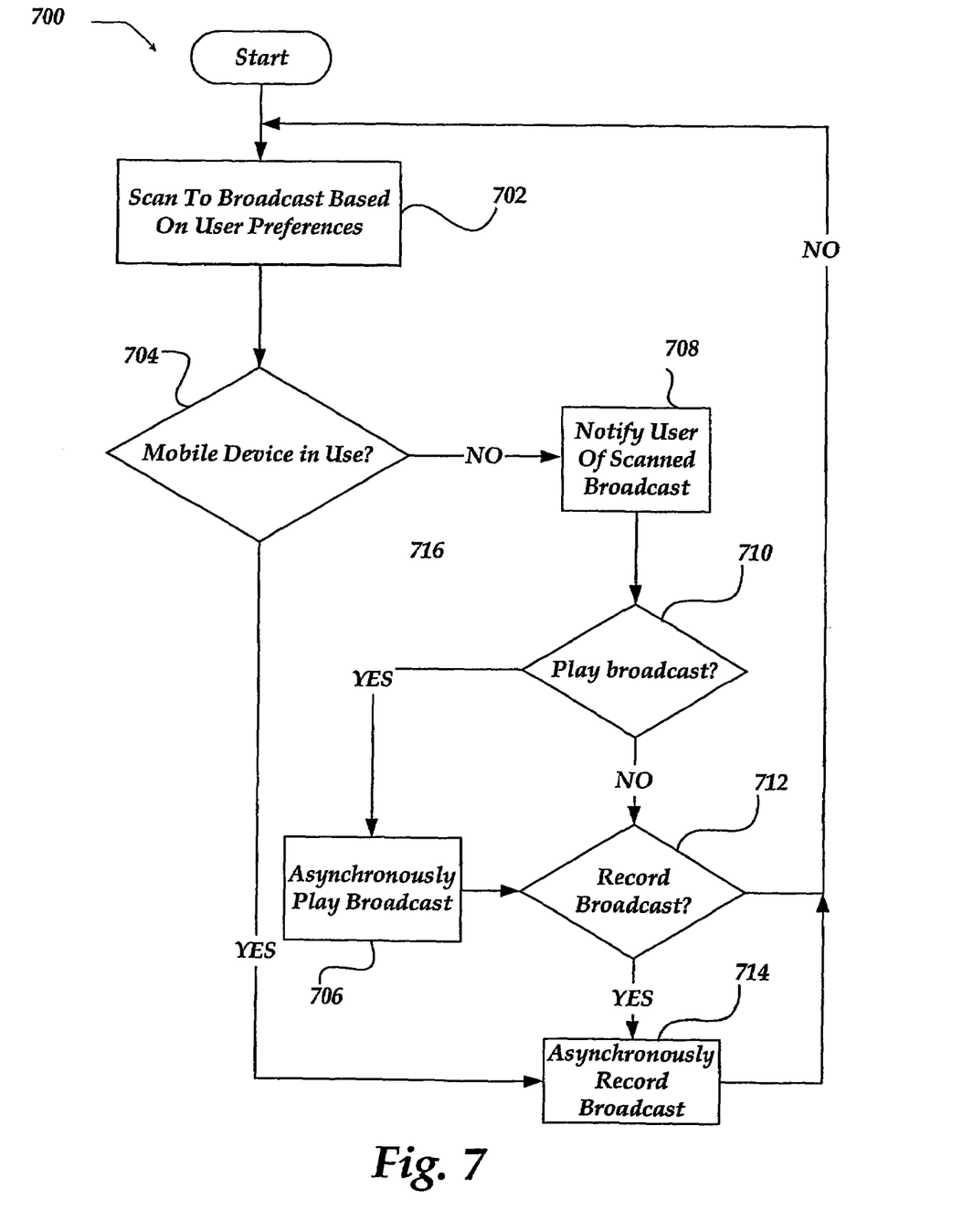
FIG. 7 is a flow chart that shows an overview of the process for playing and recording a broadcast when a mobile device is employed for another purpose.

FIG. 7 illustrates a flow chart 700 for another process where the mobile device may be currently in use for another function different than playing a broadcast. Moving from a start block, the process moves to block 702 where a first tuner scans and tunes to a broadcast based on user preference. At decision block 704, a determination is made as to whether the mobile device is in use for another function different than playing a broadcast. For example, the user may be employing the mobile device to play a game or make a telephone call.

When the determination at decision block 704 is affirmative, the process moves to block 714 where the scanned broadcast is asynchronously recorded. Next, the process loops back to block 702 and resumes performing substantially the same process discussed above. However, when the determination at decision block 704 is negative, the process moves to block 708 where notification of the scanned broadcast is provided. Also, when any previously scanned broadcast has been recorded, notification of this recording can be provided. Advancing to decision block 710, a determination is made whether to play the scanned broadcast or previously recorded broadcast. If affirmative, the process flows to block 706 where the first tuner asynchronously plays the broadcast or the recorded broadcast with the mobile device. Next, the process moves to decision block 712 where another determination is made regarding whether the scanned broadcast will be recorded for play back at a later date. Also, when the determination at decision block 710 is negative, the process moves to decision block 712.

If the determination at decision block 712 is negative, the process loops back to block 702 and resumes performing substantially the same process discussed above. However, a second tuner will be employed to scan and tune to another broadcast based on user preference when the first tuner is being used to play the previously scanned broadcast.

Alternatively, when the determination at decision block 712 is affirmative, the process advances to block 714 where the scanned broadcast is recorded for play back at a later date. Next, the process loops back to block 702 and resumes performing substantially the same process discussed above.

Figure 8:
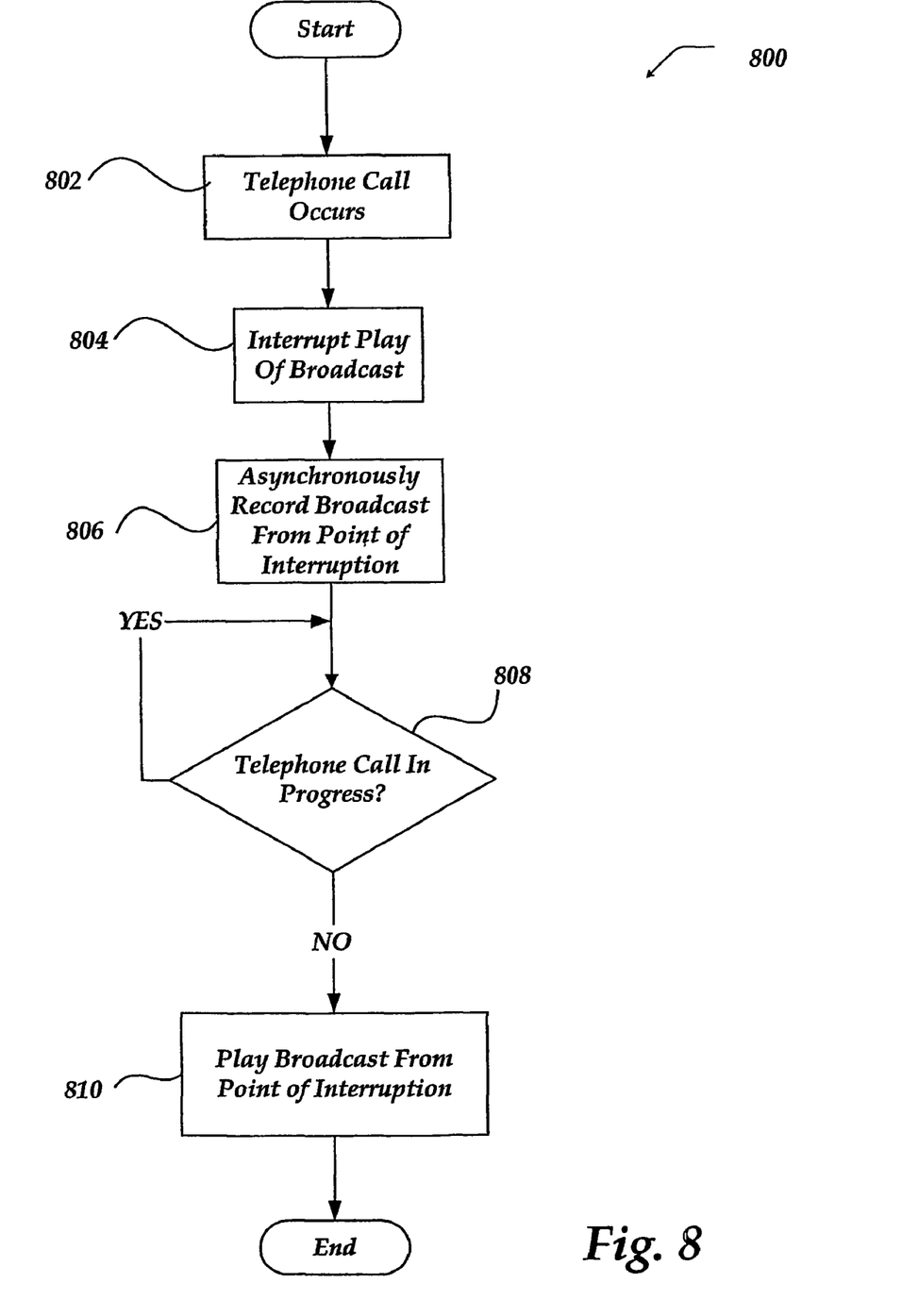
FIG. 8 is a flow chart that illustrates an overview of process for handling the interruption of a broadcast when the mobile device is used for a telephone call.

FIG. 8 illustrates a flow chart 800 for another process where a telephone call interrupts the playing of a broadcast with the mobile device. Moving from the start block, the process advances to block 802 where a telephone call occurs with the mobile device. For example, the mobile device receives an incoming telephone call or the user initiates a telephone call. The process flows to block 804 where the playing of the broadcast by the mobile device is interrupted. Advancing to block 806, the broadcast is asynchronously recorded from the point of interruption.

At decision block 808, a determination is made as to whether the use of the mobile device for a telephone call is still in progress. If affirmative, the process loops at decision block 808 until the determination is negative. When the determination at decision block 808 is negative, the process moves to block 808 where the recorded broadcast is employed to start playing from the point of interruption. Next, the process moves to the end block and returns to performing other actions.

Figure 9:
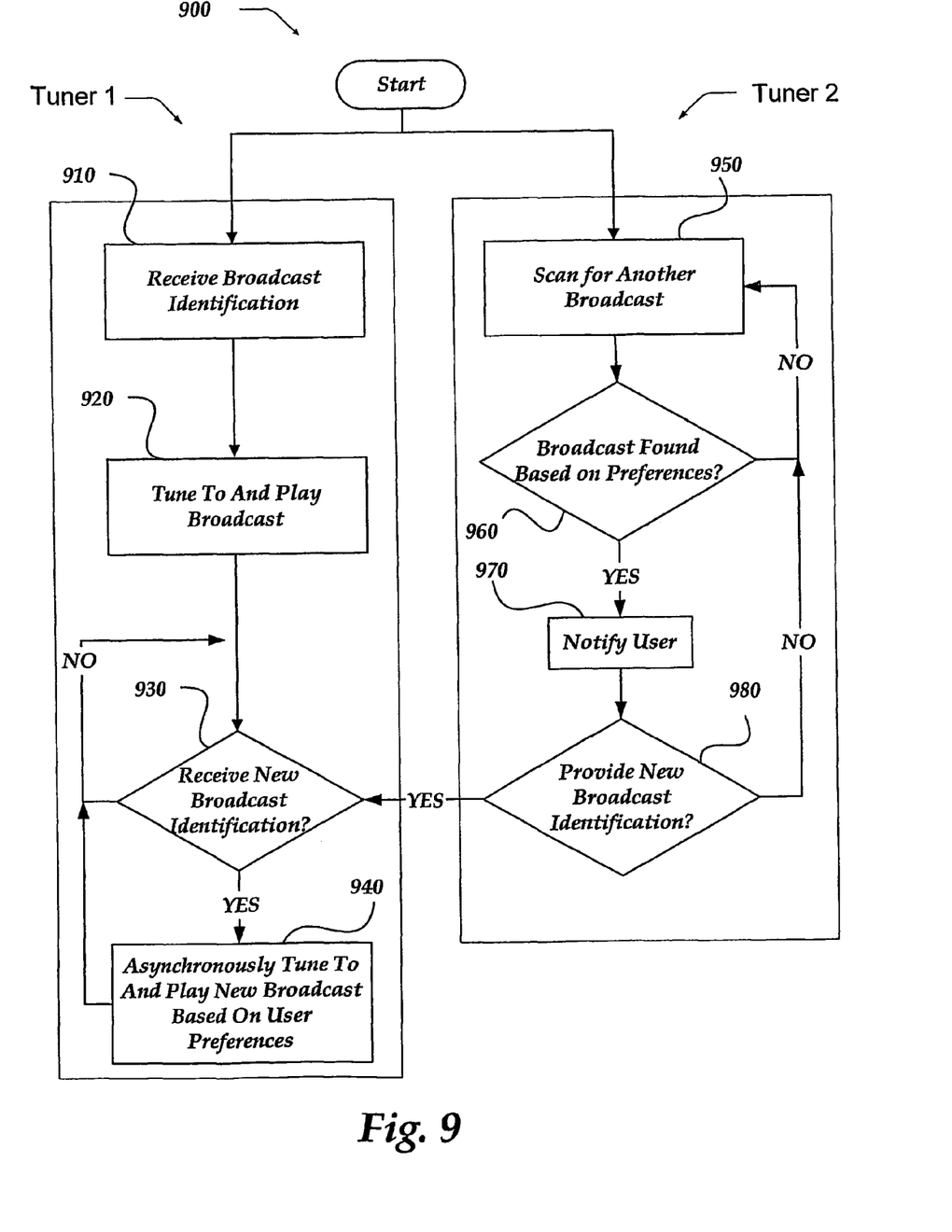
FIG. 9 is a flow chart that shows parallel processes simultaneously performed for two tuners included with the mobile device, in accordance with the invention.

FIG. 9 shows a flow chart 900 illustrating parallel processes for the use of two tuners in a mobile device. Moving from a start block, two parallel processes are presented for a first tuner and a second tuner. For the first tuner, a first process moves to a block 910 where information identifying a particular broadcast is received. This information may be provided by the user, or the first tuner may have identified a scanned broadcast based on user preference. In either case, the first process moves to a block 920 where the first tuner is tuned to the identified broadcast (if not already) and is employed to play the broadcast with the mobile device.

The first process advances to decision block 930 where a determination is made whether new information has been received for another broadcast. The new information may be entered by the user, provided by the first tuner for another scanned broadcast based on user preference when it is done playing the previously identified broadcast, or provided by the second tuner for a scanned broadcast based on user preference. In any case, when the determination is negative, the first process loops at decision block 930 until the determination is affirmative.

When the determination at decision block 930 is affirmative, the first process moves to block 940 where the mobile device asynchronously tunes to and plays the newly identified broadcast. Next, the first process loops back to decision block 930 and performs substantially the same process as described above.

The second process moves to block 950 where the second tuner scans for another broadcast based on user preference. The second process advances to decision block 960 where a determination is made whether another scanned broadcast based on user preference was identified by the second tuner. If the determination is negative, the process loops at block 960 until the determination is affirmative. When the determination at decision block 960 is affirmative, the second process flows to block 970 where the user is notified of the new information for the other scanned broadcast based on user preference.

The second process moves to a decision block 980 where a determination is made whether the new broadcast information is to be provided to the first process. If the determination is negative, the second process loops back to block 950 and performs substantially the same process discussed above. However, when the determination at decision block 950 is affirmative, the new information for the other scanned broadcast is provided to the first process at decision block 930, where the first process performs substantially the same process discussed above.

The above specification, examples and data provide a complete description of the manufacture and use of the invention. Since many embodiments of the invention can be made without departing from the spirit and scope of the invention, the invention resides in the claims hereinafter appended.

I claim:

1. A method for playing a broadcast with a mobile device, comprising:
    tuning a tuner of the mobile device to a broadcast, and playing the broadcast;
    enabling another tuner to scan for another broadcast that meets at least a scan criterion;
    when the other broadcast based on the at least one scan criterion is located, enabling the other broadcast to be selectively played in lieu of the currently playing broadcast; and
    when the mobile device is selected for another purpose, interrupting the currently playing broadcast, and recording the currently playing broadcast from a point where the interruption occurred.

2. The method of claim 1, further comprising:
    when the other purpose is finished, playing the recorded broadcast from the point of interruption.

3. The method of claim 1, wherein the other purpose includes at least a selected one of a game, email, surf the Internet and make a telephone call.

4. The method of claim 1, further comprising:
    recording at least one of the currently playing broadcast and the other broadcast.

5. The method of claim 4, wherein recording the broadcast further comprises formatting the broadcast in accordance with a selected format, wherein the selected format is a selected one of MP3, MPEG and WAV.

6. The method of claim 1, further comprising scanning a spectrum of frequencies for the broadcast based on user preference, the spectrum including at least a selected one of AM, FM, television and Satellite frequencies.

7. The method of claim 1, further comprising identifying the broadcast with information, wherein the information includes at least a selected one of key word, Internet address, channel, artists, musical group, category, genre, title, and lyrics.

8. The method of claim 1, further comprising identifying the broadcast with information, wherein the information includes at least a selected one of station call letters, network address and frequency.

9. The method of claim 1, wherein at least one scan criterion comprises a user preference, and the method further comprises obtaining the user preference.

10. The method of claim 9, wherein said obtaining of the user preference includes at least a selected one of receiving information from the user, a service, a station and a server over a network.

11. The method of claim 9, wherein said obtaining of the user preference includes determining a pattern of user activity and creating the user preference based on the pattern of user activity.

12. The method of claim 1, wherein the broadcast includes at least a selected one of audio, video, graphic, image, animation, color and text.

13. The method of claim 1, wherein said scanning comprises scanning for a plurality of IP addresses.

14. A mobile device that provides for telecommunication and playing broadcasts, comprising:
    a first and second tuner to alternate in tuning to a current playing broadcast and scanning for another broadcast based on at least one scan criterion;
    a player to play a broadcast; and
    an application communicatively coupled to the tuners and the player to control said alternate tuning and scanning by said first and second tuners, and said playing of a broadcast by said player;
    wherein the application is further equipped to interrupt the currently playing broadcast when the mobile device is selected for another purpose, and causes the currently playing broadcast to be recorded from a point of interruption.

15. The mobile device of claim 14, further comprising a recorder communicatively coupled to the application.

16. The mobile device of claim 15, further comprising a third tuner communicatively coupled to the application, to cooperate with the first and second tuner to alternate in tuning to the currently playing broadcast, scanning for another broadcast, and recording broadcasts.

17. The mobile device of claim 14, wherein the application is further equipped to employ the player to play the recorded broadcast.

18. The mobile device of claim 14, wherein at least one scan criterion comprises a user preference, and the application is further equipped to obtain the user preference.

19. The mobile device of claim 18, wherein the application is equipped to obtain the user preference from a selected one of receiving the user preference from a user, inferring the user preference from the user's actions, and retrieving the user preference from a service.

20. The mobile device of claim 14, further comprising a display communicatively coupled to the application to indicate information related to at least a selected one of user preference, currently playing broadcast and other broadcast.

21. The mobile device of claim 14, wherein the mobile device is a selected one of a wireless mobile phone, a pager, a personal digital assistant (PDA), a palm-sized computing device, a laptop computer, a portable radio, a portable MPx player, and a portable CD/DVD player.

22. A method for playing a broadcast with a mobile device, comprising:
tuning a tuner of the mobile device to a broadcast, and playing the broadcast; and
when the mobile device is selected for another purpose, interrupting the currently playing broadcast, and recording the currently playing broadcast from a point where the interruption occurred.

23. A mobile device that provides for telecommunication and playing broadcasts, comprising:
a tuner to tune to a current playing broadcast;
a player to play a broadcast; and
an application communicatively coupled to the tuner and the player to control said tuner and said player;
wherein the application is further equipped to interrupt the currently playing broadcast when the mobile device is selected for another purpose, and causes the currently playing broadcast to be recorded from a point of interruption.

24. A mobile device that provides for telecommunication and playing broadcasts, comprising:
a first and second tuner to alternate in tuning to a current playing broadcast and scanning for another broadcast based on at least one scan criterion;
a player coupled to the first and second tuners to selectively play a broadcast; and
an application communicatively coupled to the tuners and the player to control said alternate tuning and scanning by said first and second tuners, and said playing of a broadcast by said player;
wherein the application is further equipped to interrupt a currently playing broadcast when a telephone call is placed or received using the mobile device.

25. The mobile device of claim 24, wherein the at least one scan criterion comprises a user preference, and the application is further equipped to obtain the user preference.

26. The mobile device of claim 25, wherein the application is equipped to obtain the user preference by at least a selected one of receiving information from the user, a service, a station or a server over a network.

27. The mobile device of claim 25, wherein the application is equipped to obtain the user preference by determining a pattern of user activity and creating the user preference based on the pattern of user activity.

* * * * *

UNITED STATES PATENT AND TRADEMARK OFFICE
CERTIFICATE OF CORRECTION

| | |
|---|---|
| PATENT NO. | : 7,065,333 B2 |
| APPLICATION NO. | : 10/477048 |
| DATED | : June 20, 2006 |
| INVENTOR(S) | : G. Eric Engstrom |

It is certified that error appears in the above-identified patent and that said Letters Patent is hereby corrected as shown below:

Column 5
Line 13, "...communication media. Generally,..." should read --...communication media. Generally,...--.
Line 22, "...media The term..." should read --...media. The term...--.

Column 6
Line 48, "...an HTTP handler application..." should read --...an HTTPS handler application...--.

Column 7
Line 39, "...media Computer..." should read --...media. Computer...--.

Signed and Sealed this

Nineteenth Day of June, 2007

JON W. DUDAS
*Director of the United States Patent and Trademark Office*